United States Patent [19]

Pophillat et al.

[11] 4,280,765

[45] Jul. 28, 1981

[54] OPTICAL FIBER TRANSFER FUNCTION MEASURING SYSTEM

[76] Inventors: Lucien J. P. Pophillat, Croix Rolland Rospez; Jean J. Moalic, 40, Avenue d'Alsace, both of Lannion, France, 22300; Yvon J. Sorel, Kernu Louannec, Perros Guirec, France, 22700

[21] Appl. No.: 125,088

[22] Filed: Feb. 27, 1980

[30] Foreign Application Priority Data

Mar. 2, 1979 [FR] France .................... 79 05543

[51] Int. Cl.³ ........................................... G01N 21/84
[52] U.S. Cl. ........................................... 356/73.1
[58] Field of Search ........................... 356/73.1, 124.5

[56] References Cited

PUBLICATIONS

"Measurement of Baseband Frequency Response of Multimode Fibre by Using a New Type of Mode Scrambler", Tokuda et al., Electronic Letters, Mar. 3, 1977, vol. 13, No. 5, pp. 146-147.

*Primary Examiner*—Vincent P. McGraw
*Attorney, Agent, or Firm*—Abraham A. Saffitz

[57] ABSTRACT

The transfer modulation measuring system is made up of an adjustable multifrequency generator, a laser emission circuit, an optical detector and a spectrum analyzer. The generator includes oscillators at predetermined frequencies belonging to a discrete frequency distribution. Component signals at selected predetermined frequencies may be time-division multiplexed or frequency-division multiplexed into an electrical composite signal which modulates the laser emission. The system comprises also two optical fiber connectors and a so-called priming optical fiber which excits uniformly the propagation modes at the entrance end of the optical fiber to be measured. During a calibration phase, the connectors are joined end-to-end and aligned optically. The spectral lines at predetermined frequencies are successively adjusted to a same predetermined level on the screen of the spectrum analyzer by means of potentiometers adjusting the amplitudes of the component signals. These adjustments contribute the transfer function of the optical fiber to be displayed directly on the screen of the spectrum analyzer during the measurement phase for which the optical fiber to be measured is connected between the two connectors. The modulated light signal crossing the optical fiber arises from the modulation of the selected time-multiplexed or simultaneously mixed frequencies.

18 Claims, 4 Drawing Figures

OPTICAL FIBER TRANSFER FUNCTION MEASURING SYSTEM

CROSS REFERENCE TO RELATED APPLICATIONS

Applicants hereby make cross references to their French Patent Application PV 79 05543, filed Mar. 2, 1979 and claim priority thereunder following the provisions of 35 U.S.C. 119.

BACKGROUND OF THE INVENTION

1. Field of the Invention

This invention relates to a transfer function system for measuring the modulation transfer function of a single optical fiber.

2. Description of the Prior Art

The known optical fiber transfer function measuring systems comprises a generator for producing a first electrical signal, a laser source for converting the first electrical signal into an initial modulated light signal to be delivered to the entrance end of the optical fiber to be measured, an optical detector for converting the outputting light signal from the emergent end of the optical fiber into a second electrical signal and spectrum analyzis means for displaying the spectral lines of the second electrical signal as a function of the frequency.

Two types of transfer function measuring systems have been proposed in the prior art.

A first type of system concerns the swept frequency method. The first electrical signal producing generator is a vobulator which produces a first electrical signal whose frequency varies continually and cyclically. This first electrical signal is transmitted to the laser source which converts it into a carrier light signal modulated by the vobulation frequency. The modulated light signal is transmitted to the entrance end of the optical fiber through an optical lens device. Such a measuring system is disclosed in the contribution No. 208, Study Group XV, of the International Telegraph and Telephone Consultative Committee (C.C.I.T.T.) October 1978, entitled "Considerations on transmission characteristics of measurement methods of optical fibers".

During a calibration phase, i.e. when the laser source is in direct optical coupling with the optical detector, without coupling through the optical fiber to be measured, a response curve is stored in a digital memory of spectrum analyzis means so as to serve as a reference for the ulterior measurement of the transfer function of the optical fiber. This reference response curve is not a constant function independent on the vobulation frequency band because it is dependent on the transfer functions peculiar to the laser source and the optical detector. Consequently, at the time of the measurement phase for which the optical fiber is inserted between the laser source and the optical detector, it is necessary to calculate the difference, relative to the power of the second electrical signal transmitted by the output of the optical detector to the spectrum analysis means, between stored reference response curve and the response curve obtained during the measurement phase, in order to deduce the modulation transfer function proper to the optical fiber. This measurement method does not take into account the optimal conditions for injection of the light signal into the entrance end of the optical fiber to be measured. The injection conditions are relative to the mode coupling of the light signal which is normally balanced in an optical fiber after transmission through it over a great length. Because the radiation pattern of the injected light signal into the entrance end of the optical fiber to be measured is not equal to the balanced radiation pattern in the optical fiber, it means that the measurement according to the above method does not give an exact knowledge of the transfer function proper to the optical fiber.

Moreover, it will be noted that the system according to the vobulation measurement method requires that the vobulator sweeping frequency to be transmitted through an auxiliary electrical conductor to the spectrum analyzis means. This excludes the measurements of an optical fiber having a great length, such as those relative to the laying of an optical multifiber cable on a worksite, where the entrance and emergent ends are not adjoining or in the same room.

The second type of known systems and methods for measuring the transfer function of an optical fiber are based on the pulse response of the optical fiber. In this case, the generator producing the first electrical signal modulating the laser emission consists of an adjustable frequency short pulse generator. The measurement method on the reception side are based on time analyzis, or on the spectral analyzis of a short light pulse delivered by the optical fiber. Such methods and systems are described in communication V., pages 123 to 134, of the Second European Symposium on Optical Fiber Transmission, September 1975 and concerning spectral analyzis, in the article on pages 43 to 48, Vol. 25, No. 1, of the journal "Optics Communications", April 1978, and also in French Pat. No. 2,296,842.

According to the time analyzis method, the dynamic measurement is reduced and the precision depends on the sharpness of the light pulse transmitted to the entrance end of the optical fiber. This method requires powerful calculation facilities to obtain the relatively imprecise transfer function of the optical fiber.

The low power contained in each spectral line, especially at high frequencies, also reduces the precision of the transfer function measured according to the spectral analyzis method.

On the other hand, certain systems set up according to pulse response measurement method take into account the attainment of a balance state in the mode coupling at the entrance end of the optical fiber. In this connection, a mode balance simulator is interdonnected optically between the laser source and the entrance end of the optical fiber. This simulator can be made by compressing the first 20 centimeters of the optical fiber between some emery cloth and an elastomeric plate which impose some random microcurves on the fiber thereby inducing a strong coupling of the modes. According to another embodiment, the simulator is made with a so-called priming optical fiber which has the same structural features as the ones of the optical fiber to be measured and which is interconnected optically between the laser source and the optical fiber to be measured. The priming optical fiber is very long, about a kilometer, so that the irregular distribution of the propagation modes in front of the laser source at the entrance end of the priming optical fiber becomes progressively homogenous or uniform as one moves away from it. Consequently, a balance state is obtained before the emergent end of the priming optical fiber and corollary at least at the entrance end of the optical fiber to be measured.

OBJECT OF THE INVENTION

Accordingly, the main object of this invention is to provide an optical fiber modulation transfer function measuring system by means of which the measurement result depends neither on the transfer functions of the elements localized on the transmission path of the light signal, nor on the injection conditions of the light signal at the entrance end of the optical fiber to be measured.

SUMMARY OF THE INVENTION

In accordance with the aforementioned object, there is provided a transfer function measuring system for measuring the transfer function of an optical fiber, said system comprising:

means for producing a first electrical composite signal having a discrete distribution of predetermined component frequencies;

laser emission means for converting said first electrical signal into a modulated light signal which is adapter to be transmitted through said optical fiber into the uniformly excitation condition of the mode coupling;

optical detection means for converting the light signal outputting from said optical fiber into a second electrical composite signal;

means for analyzing the spectrum of said second electrical signal to display said transfer function of said optical fiber by measurement of the power of said second electrical as a function of said predetermined discrete frequency distribution; and means included in said first electrical signal producing means for adjusting the amplitude of said first electrical signal to equalize the levels of the displayed spectral lines at said predetermined frequencies during a calibration phase for which said laser emission means transmits directly said modulated light signal to said optical detection means.

The measurement method according to the invention presents a calibration phase and a measurement phase.

For the calibration phase, the output element of a first connector whose the input element receives the balanced light signal from the laser source through a priming optical fiber, and the input element of a second connector whose the output member faces to the optical detector are joined end-to-end. Then, the levels of the spectral lines displayed by a spectrum analyzer and corresponding to predetermined component frequencies from the first electrical signal are adjusted at a common predetermined level.

For the measurement phase, the entrance and emergent ends of the optical fiber to be measured are inserted in the output element of the first connector and the input element of the second connector, respectively. The frequency composition of the first electrical signal is selected so that it arises from the frequency-division multiplexing (i.e. simultaneous mixing) or from time-division multiplexing of the components signals, each one having a selected predetermined component frequency.

Thanks to the calibration phase during which the level of the spectral lines corresponding to the discrete distribution of the predetermined frequencies are equalized at a predetermined power level to constitute a rectilinear response curve independent of the frequency, the influence of the transfer functions, especially from the laser source, the priming optical fiber and the optical detector, is eliminated in the measurement result. The exact transfer function of the optical fiber is then visualized directly on the screen of the spectrum analyzer at the time of the measurement phase. This is contrary to the known methods according to which it is necessary to work out a difference of spectrums to obtain the soughtafter transfer function. In particular, contrary to the vobulation method, the unbalancing influence of the mode coupling is eliminated by the optical interconnection of a very long priming optical fiber lead between the laser source and the entrance end of the optical fiber to be measured.

The means for generating the first electrical composite signal with component frequencies according to a discrete distribution allows a more advantageous selectioning of the measurements relative to the predetermined frequency ranges. According to an aspect of the invention, the first electrical signal producing means includes a plurality of oscillators, each one transmitting through a tuned circuit an electrical sinusoidal component signal with a predetermined component frequency different from those assigned to the other oscillators to modulate the emission of the laser source. Means for adjusting the amplitude of the sinusoidal component signal are connected to the power supply terminal of each oscillator for the purpose of equalizing the corresponding spectral line at the predetermined power level during the calibration phase. Switching means permits the simultaneous or cyclical selecting of a certain number of oscillators by turning on their power supply, so that the first electric signal modulating the laser emission results from the simultaneous mixing or from the time multiplexing of the sinusoidal signals at the selected component frequencies.

The measuring system embodying the invention fits as well for measurement in laboratory as for point-to-point measurements on the connections of an optical multifiber cable. The measurements can be relative to a large range of component frequencies and to a large range of lengths of optical fibers to be measured.

BRIEF DESCRIPTION OF THE DRAWING

Other advantages and features of this invention will be apparent from the following more particular description of a preferred embodiment of the invention as illustrated in the accompanying drawings, in which.

DESCRIPTION OF THE PREFERRED EMBODIMENT

Figure 1:
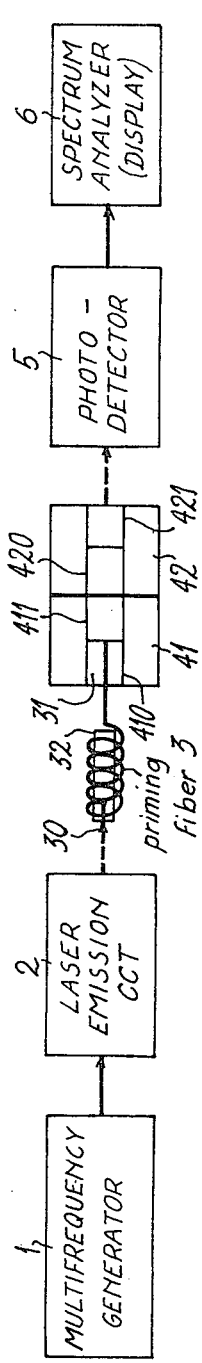
FIG. 1 is a schematic block-diagram of the measuring system during the calibration phase.
Figure 2:
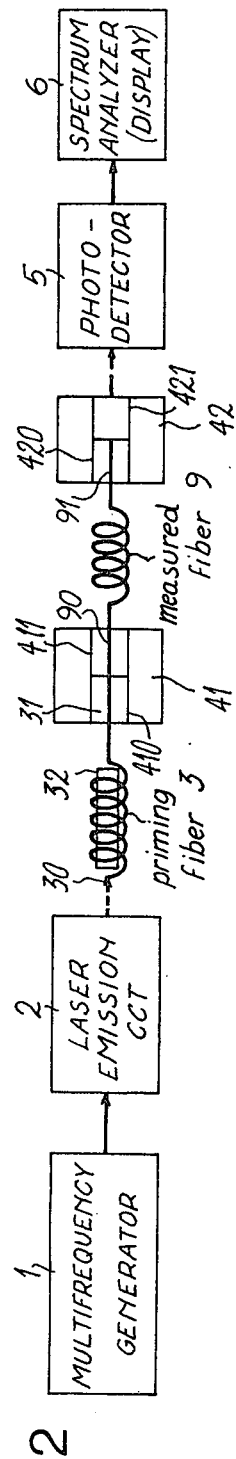
FIG. 2 is a schematic block diagram of the measuring system during the measurement phase.

As shown in FIGS. 1 and 2, the modulation transfer function measuring system embodying the invention includes an emitting part which is located upstream from a priming fiber, and a receiving and analyzing part which is located downstream from the priming fiber.

The emitting part includes a multifrequency generator 1 which generates sinusoidal component signals with predetermined frequencies. The predetermined frequency signals are mixed in frequency when they are emitted simultaneously, or time-division multiplexed when they are selected periodically, as will be explained further on in reference to the FIG. 4. A first multifrequency voltage signal arising from the time—or frequency—division multiplexing of the component signals is delivered from the generator 1 to a laser emission circuit 2 to modulate a laser source such as a direct operating laser diode which is biased in class A.

Then, the laser emission circuit 2 converts the first electrical signal into a multifrequency modulated light signal which is injected into the entrance end 30 of a so-called "priming" optical fiber 3, either directly and classically without any particular precautions, or by centering the optical axis of the laser diode of the laser emission circuit 2, possibly through some optical collimating and focussing means (not shown). The priming fiber 3 has the same structural and dimensional features relative to its cross section as those of the optical fiber to be measured. The length of the priming fiber 3 is sufficiently long, about a kilometer, so that the uniformly excitation state of the propagation modes (balanced state) conveyed by the light signal may be reached as late as possible at the emergent end of the priming fiber 3. The priming fiber 3 is, for example, rolled around a drum 32 which has a diameter equal to 200 mm and a length equal to 100 mm.

The emergent end 31 of the priming fiber 3 is inserted into a first terminal member or input terminal 410 of a first optical fiber connector 41 while the other terminal member or output terminal 411 will include the entrance end of the optical fiber to be measured during the measurement phase. The terminal members and optical fiber connectors used in this invention may be analogous to those described in the U.S. Pat. No. 4,160,580 issued July 10, 1979.

The receiving and analyzing part of the measuring system includes a second optical fiber connector 42 which transmits the multifrequency modulated light signal directly to a photodetector 5 during the calibration phase shown in FIG. 1. The photodetector 5 includes a photo-sensitive element such as a pin diode which converts the received light signal into a second multifrequency electric signal according to a quadratic law which is function of the power ratio between the power of the second output electrical signal and the power of the incoming light signal. Then the second electric signal is delivered to a spectrum analyzer 6 which permits the modulation transfer function to be analyzed and displayed, i.e. the electric power received in the photodetector 5 as a function of the frequency, as shown in the FIG. 3.

Figure 4:
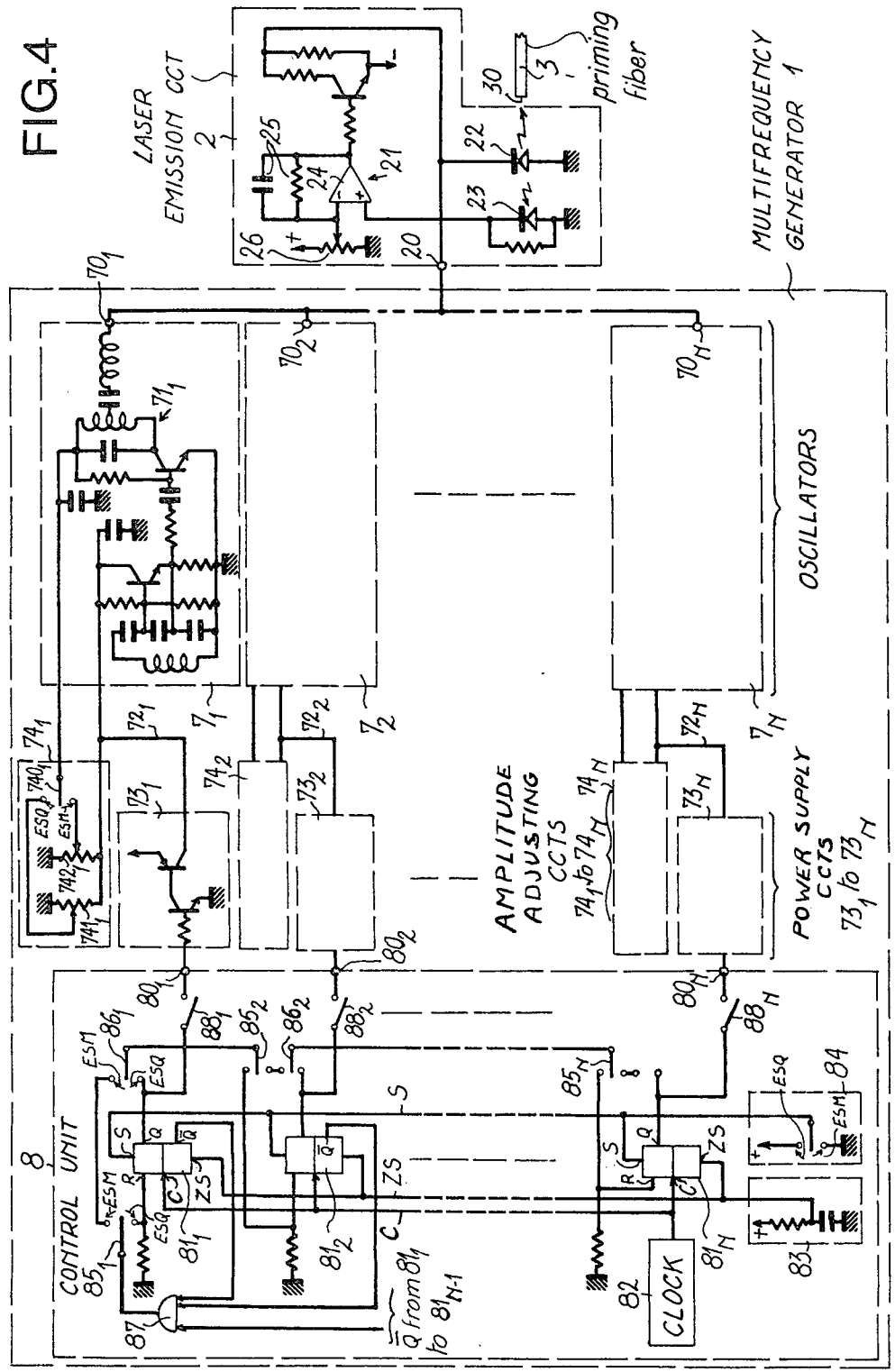
FIG. 4 is a detailed block-diagram of the multifrequency generator and the laser emission circuit.

Referring now to FIG. 4, details will be found of the multifrequency generator 1 embodying the invention as well as the laser emission circuit 2.

The multifrequency generator 1 is made up essentially of N oscillators $7_1$ to $7_N$ and a control unit 8 which controls selectively the power supply to the oscillators. Each oscillator delivers at its output terminals $70_1$ to $70_N$ a sinusoidal signal which has a predetermined oscillation frequency different from the frequencies assigned to the other oscillators. This output transmission of the sinusoidal signal is accomplished through an inductive and capacitive coupling circuit $71_1$ to $71_N$ tuned to the predetermined frequency. The component signal is emitted when the power supply input terminal $72_1$ to $72_N$ of the oscillator $7_1$ to $7_N$ is switched on by means of a two-transistor power supply circuit $73_1$ to $73_N$ which is monitored by the corresponding output terminal $80_1$ to $80_N$ of the control unit 8.

The control unit 8 controlling the power supply circuits $73_1$ to $73_N$ is made up essentially of a shift register which comprises N flips-flops $81_1$ to $81_N$. The clock input C of each flip-flop is connected to a clock 82 which produces a clock signal, each period of which selects one of oscillator power supply circuits. The time period T of the clock signal corresponds to the emission duration of a component signal at a predetermined frequency which corresponds to an oscillator $7_1$ to $7_N$ when the sequential emission ESQ (time-division emission) of the oscillators is selected. The flips-flops $81_1$ to $81_N$ are reset to zero by their ZS inputs by means of a reinitialization circuit 83, at the time the system is switched on. The condition of the reset inputs in state "1", S, of the flips-flops is controlled by a two-contact switch 84. The switch 84 places the S inputs in state "1" when the system operates in the sequential emission phase ESQ, and places the S inputs in the state "0" when the system operates in the simultaneous emission phase ESM (frequency-division emission).

The input R of each flip-flop $81_1$ to $81_N$ is connected to one of the stationary contacts of a switch $85_1$ to $85_N$. The output Q of each flip-flop is connected to one of the stationary contacts of a switch $86_1$ to $86_N$. The two other stationary contacts of a pair of switches $85_1$–$86_1$ to $85_N$–$86_N$ are connected to each other. The movable contact of a switch such as $86_1$, connected to the output Q of a flip-flop such as $81_1$, is connected to the movable contact of the switch such as $85_2$, assigned to the input R of the following flip-flop such as $81_2$. The complementary outputs Q of the flips-flops $81_1$ to $81_{N-1}$ are connected to the (N-1) inputs of an AND-gate 87 whose output feeds the movable contact of the switch $85_1$ which is connected to the input R of the first flip-flop $81_1$. Further, the output Q of each flip-flop $81_1$ to $81_N$ is connected to the input $80_1$ to $80_N$ of the power supply circuit $73_1$ to $73_N$ of the corresponding oscillator $7_1$ to $7_N$ by means of a simple one-stationary contact switch $88_1$ to $88_N$.

From the preceding description of the control unit 8, it appears that (a) a switch $88_1$ to $88_N$ is closed when the frequency of the corresponding oscillator $7_1$ to $7_N$ is selected and must be transmitted either periodically or mixed with the other frequencies of the selected oscillators in the first composite signal outputting from the generator 1;

(b) when the switch 84 selects the simultaneous emission phase ESM, at least all the pairs of switches $85_1$–$86_1$ to $85_N$–$86_N$ corresponding to the frequencies selected by the closed one-contact switches $88_1$ to $88_N$ short-circuit the flips-flops $81_1$ to $81_N$ so that the selected power supply circuits $73_1$ to $73_N$ simultaneously feed the corresponding oscillators;

(c) when the switch 84 selects the sequential emission phase ESQ, the movable contacts of the switches $85_1$ to $85_N$ are connected to the inputs R of the corresponding flips-flops $81_1$ to $81_N$, and the movable contacts of the switches $86_1$ to $86_N$ are connected to the outputs Q of the corresponding flips-flops $81_1$ to $81_N$ so that after N periods T of the clock 82 the component signal assigned to each of the oscillators selected by the closed switches $88_1$ to $88_N$ may be emitted one during a sequence NT. It will be noted that for the sequential emission phase ESQ the pairs of switches $85_1$–$86_1$ to $85_N$–$86_N$ assigned to the non-selected oscillators can short-circuit the corresponding flips-flops. This enables the sequence to be reduced proportionally to the number of selected oscillators.

It can also be seen on FIG. 4 that an amplitude adjusting circuit $74_1$ to $74_N$ is also connected to the power supply input $72_1$ to $72_N$ of each oscillator $7_1$ to $7_N$. Each circuit $74_1$ to $74_N$ enables the adjustment of the amplitude of the component sinusoidal signal emitted by the output $70_1$ to $70_N$ to a predetermined amplitude. Each adjusting circuit $74_1$ to $74_N$ includes a switch $740_1$ to $740_N$ which selects the amplitude of the emitted component sinusoidal signal in dependence of the sequential ESQ or simultaneous ESM emission type so that the laser diode operates normally. For each emission type, the amplitude of each selected component sinusoidal signal is adjusted by a potentiometer $741_1$ to $741_N$ or $742_1$ to $742_N$.

The output terminals $70_1$ to $70_N$ of all the oscillators ae connected to the input terminal 20 of the laser emission circuit 2. This latter includes a feedback loop 21 for adjusting the bias-voltage of the laser diode 22. The feedback loop 21 is made up of at least one photodiode 23, which is coupled optically with the rear face of the laser diode 22, and an operational amplifier 24. The amplifier 24 operates as a voltage comparator and has a high frequency capacitive feedback circuit 25. The direct input (+) of the amplifier 24 is connected to the photodiode 22. The inverse input (−) of the amplifier 24 is connected to a potentiometer 26. The optimal operating point of the laser diode 22 is adjusted by means of the potentiometer 26 so that the laser diode may operate in class A by the excitation current through its operating range.

Referring again to FIGS. 1 and 2, the method for the measurement of the modulation transfer function of an optical fiber 9 having a predetermined length will now be described. The measurement can relate to either an optical fiber included in a multifiber cable on a worksite or to the study of one of the transmission characteristics of a given optical fiber in laboratory.

Figure 3:
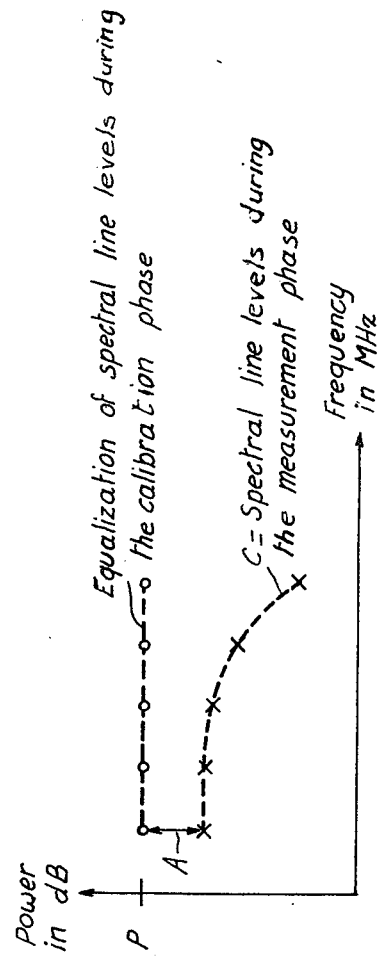
FIG. 3 is a diagram showing the power-frequency response curves displayed on the spectral analyzer screen following the calibration phase and during the measurement phase.

At the time of the calibration phase illustrated in FIG. 1, the output terminal member 411 of the first connector 41 and the input terminal member 420 of the second connector 42 are joined end-to-end and aligned optically. The calibration consists of adjusting the amplitude of the electrical component signal transmitted by each oscillator $7_1$ to $7_N$ of the multifrequency generator 1 so that all the spectral lines observed at the spectrum analyzer 6, each one corresponding to a component frequency of the composite light signal, may have the same predetermined level P, as shown in FIG. 3. In this end (FIG. 4), all the power supply switches $88_1$ to $88_N$ are closed. For example, the sequential emission ESQ is selected by means of the switches 84, $85_1$ to $85_N$ and $86_1$ to $86_N$ of the control unit 8, in the corresponding connection positions indicated previously, as well as by means of the switches $740_1$ to $740_N$ of the amplitude adjusting circuits $74_1$ to $74_N$. The potentiometers $741_1$ to $741_N$ allow the amplitude of the output component signals of the oscillators to be adjusted and, consequently, to equalize the level of the component spectral lines at the predetermined level P. One proceeds in the same manner by inverting the position of the movable contacts of the preceding switches for selecting the simultaneous emission ESM and to equalize the levels of the spectral lines of the N component frequencies at the predetermined level P by means of the potentiometer $742_1$ to $742_N$ of the amplitude adjusting circuits $74_1$ to $74_N$. One can also proceeds with successive adjustments of levels by closing an one-contact switch $88_1$ to $88_N$ and by opening the others so as to select successively the composant frequency assigned to each oscillator during the adjustment of the assigned spectral line level.

In this manner, during the calibration phase, the fact of having equalized all the levels of the spectral lines corresponding to the component frequencies permits the transfer functions proper to the laser diode 21, the priming fiber 3 and the photodetector 5 to become independent on the measurement.

At the time of the measurement phase illustrated in FIG. 2, the entrance and emergent ends of the optical fiber 9 to be measured are inserted respectively in the first and second connectors 41, 42. The entrance end 90 of the optical fiber 9 is inserted in the output terminal member 411 of the first connector 41. The emergent end 91 of the optical fiber 9 is inserted in the input terminal member 420 of the second connector 42. The method for assembling the terminals in the connector bodies 41 and 42 is consistant, for example, with the method described in the U.S. Pat. No. 4,160,580 already cited. The relative positions of the elements such as the laser diode 21, the priming fiber 3, the connectors 41 and 42 and the photodetector 5 with respect to the transmission of the light signal remain comparatively unchanged in the calibration phase shown in FIG. 1.

According to the operational requirements of the optical fiber 9, one can proceed with the study of the transfer function and as a corollary, of the attenuation coefficient of the optical fiber 9 relatively, for example, to a predetermined frequency range by closing one-contact switches $88_1$ to $88_n$ power supplying the oscillators $7_1$ to $7_n$ whose the n associated component frequencies belong to the predetermined frequency range, and in opening the others. The measurement can be accomplished in sequential emission ESQ of the selected component frequencies for which case, the laser diode 22 emits a composite light signal which presents a sequence equal to NT, or preferably equal to nT, and which is modulated by time-division multiplexing of the selected component frequency signals, each one emitted during an elementary period T of a sequence NT or nT. The measurement can also be established by simultaneous emission ESM for which the laser diode 22 emits a composite light signal which is modulated by the mixing (frequency-division multiplexing) of the n selected component frequency signals emitted simultaneously. As already stated, the choice of the emission type is selected by the switches 84, $85_1$ to $85_N$, $86_1$ to $86_N$ and $740_1$ to $740_N$ of the multifrequency generator 1.

FIG. 3 shows the power-frequency response curve C of the optical fiber 9 which is displayed on the screen of the spectrum analyzer 6. The x-axis indicates the frequencies in MHz and the y-axis indicates the power levels in decibels. The crosses designate the spectral line levels at the n selected component frequencies. The curve C represents the variations of the transfer function module of the optical fiber 9. The gap A between the predetermined level P and the spectral line level of the curve C at the lowest frequency represents the attenuation coefficient of the optical fiber and is established at the time of the calibration phase. This attenuation coefficient A is roughly equal to that of non-modulated light.

It will be noted that the quadratic detection law of the photodetector 5 must be taken into account in the formulation of the attenuation result. If this law presents irregularities, a calibration table can be established by first calibrating the reception part composed of the elements 42, 5 and 6, by means of a calibrated attenuator.

What we claim is:

1. A transfer function measuring system for measuring the transfer function of an optical fiber, said system comprising:
   means for producing a first electrical composite signal having a discrete disribution of predetermined component frequencies;
   laser emission means for converting said first electrical signal into a modulated light signal which is adapted to be transmitted through said optical fiber into the uniformly excitation condition of the mode coupling;
   optical detection means for converting the light signal outputting from said optical fiber into a second electrical composite signal;
   means for analyzing the spectrum of said second electrical signal to display said transfer function of said optical fiber by measurement of the power of said second electrical as a function of said predetermined discrete frequency distribution; and
   means included in said first electrical signal producing means for adjusting the amplitude of said first electrical signal to equalize the levels of the displayed spectral lines at said predetermined frequencies during a calibration phase for which said laser emission means transmits directly said modulated light signal to said optical detection means.

2. A transfer function measuring system according to claim 1, comprising means for selecting a predetermined number of said component frequencies to produce a first electrical composite signal having said selected component frequencies.

3. A transfer function measuring system according to claim 1, in which said first electrical composite signal arises from time-division multiplexing of electrical component signals at said component frequencies.

4. A transfer function measuring system according to claim 1, in which said first electrical composite signal arises from frequency-division multiplexing of electrical component signals at said component frequencies.

5. A transfer function measuring system according to claim 1, in which said first electrical signal producing means comprises means for time-division multiplexing electrical component signals at said component frequencies into a first electrical time-division multiplexed signal, means for frequency-division multiplexing said electrical component signals into a first electrical frequency-division multiplexed signal and switching means for selecting said electrical time-division and frequency-division multiplexed signals to deliver one of said multiplexed signals to said laser emission means.

6. A transfer function measuring system for measuring the transfer function of an optical fiber, said system comprising:
   means for producing a first electrical composite signal having a discrete distribution of predetermined component frequencies;
   laser emission means for converting said first electrical signal into a first modulated light signal;
   optical guidance means for uniformly exciting of the mode coupling of said first modulated light signal to produce a second modulated light signal in mode balance condition;
   optical connecting means for transmitting said second modulated light signal either directly during a calibration phase or through said optical fiber during a measurement phase;
   optical detecting means for converting the light signal outputting from said optical connecting means into a second electrical composite signal;
   means for analyzing the spectrum of said second electrical signal to display said transfer function of said optical fiber during said measurement phase by measurement of the power of said second electrical signal as a function of said predetermined discrete component frequency distribution; and
   means included in said first electrical signal producing means for adjusting the amplitude of said first electrical signal to equalize the levels of the displayed spectral lines at said predetermined frequencies to a predetermined level during said calibration phase.

7. A transfer function measuring system according to claim 6, in which optical guidance means comprises a priming optical fiber having:
   an entrance end receiving said first modulated light signal;
   an emergent end delivering said second modulated light signal; and
   a length which is enough great for converting said first modulated light signal into said second modulated light signal in mode balance condition.

8. A transfer function measuring system according to claim 7, in which said optical connecting means comprises first and second optical fiber connectors each having an input terminal member and an output terminal member;
   said input member of said first connector including said emergent end of said priming optical fiber and said output terminal member of said second connector being positioned to face of said optical detecting means;
   said output member of said first connector and said input member of said second connector being lined up end-to-end during calibration phase; and
   said output member of said first connector including the entrance end of said measured optical fiber and said input member of said second connector including the emergent end of said measured optical fiber during said measurement phase.

9. A transfer function measuring system according to claim 6, in which said laser emission means comprises means included in the feedback loop of a laser source which converts said first electrical signal into said first modulated light signal, for adjusting the excitation current of said laser source so that said laser source operates in class A.

10. A transfer function measuring system for measuring the transfer function of an optical fiber, said system comprising:
    means for producing electrical component signals having each a predetermined frequency belonging to a predetermined discrete frequency distribution;
    means for mixing said electrical component signals into a first electrical composite signal arising from the frequency-division multiplexing of said electrical component signals;
    laser emission means for converting said first electrical signal into a modulated light signal which is adapted to be transmitted through said optical fiber into the uniformly excitation condition of the mode coupling;

optical detection means for converting the light signal outputting from said optical fiber into a second electrical composite signal;

means for analyzing the spectrum of said second electrical signal to display the spectral lines at said predetermined frequencies representative of said transfer function of said optical fiber by measurement of the power of said second electrical signal as a function of said predetermined discrete frequency distribution; and means connected to the power supply circuits of said electrical component signals producing means for adjusting the amplitudes of said electrical component signals to equalize the levels of the displayed spectral lines of said second electrical signal during a calibration phase for which said laser emission means transmits directly said modulated light signal to said optical detecting means.

11. A transfer function measuring system according to claim 10, in which said electrical component signals are sinusoidal signals at said predetermined frequencies, respectively.

12. A transfer function measuring system according to claim 10, in which each of said electrical component signal producing means is an oscillator including at its output a circuit tuned to the corresponding predetermined frequency.

13. A transfer function measuring system according to claim 10, comprising switching means for selecting a determined number of component signals to be mixed into said first electrical composite signal by switching on the power supply circuits of the selected component signal producing means.

14. A transfer function measuring system for measuring the transfer function of an optical fiber, said system comprising:

means for producing electrical component signals having each a predetermined frequency belonging to a predetermined discrete frequency distribution;

means for power supplying cyclically said electrical component signal producing means to deliver a first electrical composite signal arising from the time-division multiplexing of said electrical component signals;

laser emission means for converting said first electrical signal into a modulated light signal which is adapted to be transmitted through said optical fiber into the uniformly excitation condition of the mode coupling;

optical detection means for converting the light signal outputting from said optical fiber into a second electrical composite signal;

means for analyzing the spectrum of said second electrical signal to display the spectral lines at said predetermined frequencies representative of said transfer function of said optical fiber by measurement of the power of said second electrical signal as a function of said predetermined discrete frequency distribution; and means connected to the power supply circuits of said electrical component signals producing means for adjusting the amplitudes of said electrical component signals to equalize the levels of the displayed spectral lines of said second electrical signal during a calibration phase for which said laser emission means transmits directly said modulated light signal to said optical detecting means.

15. A transfer function measuring system according to claim 14, in which said cyclic power supplying means comprises a clock and a shift register rythmed by said clock and controlling cyclically the power supply circuits of said electrical component signal producing means.

16. A transfer function measuring system according to claim 15, comprising switching means connected to the outputs of said shift register and the inputs of said power supply circuits for selecting a predetermined number of component signals to be time-division multiplexed into said first electrical composite signal.

17. A transfer function measuring system according to claim 14, in which said electrical component signals are sinusoidal signals at said predetermined frequencies, respectively.

18. A transfer function measuring system according to claim 14, in which each of said electrical component signal producing means is an oscillator including at its output a circuit tuned to the corresponding predetermined frequency.

* * * * *